(12) United States Patent
Parkhideh et al.

(10) Patent No.: US 11,824,344 B1
(45) Date of Patent: Nov. 21, 2023

(54) SYSTEMS AND METHODS TO MEASURE CHANGING ELECTRIC CURRENT

(71) Applicant: The University of North Carolina at Charlotte, Charlotte, NC (US)

(72) Inventors: Babak Parkhideh, Charlotte, NC (US); Chondon Roy, Charlotte, NC (US)

(73) Assignee: The University Of North Carolina At Charlotte, Charlotte, NC (US)

(*) Notice: Subject to any disclaimer, the term of this patent is extended or adjusted under 35 U.S.C. 154(b) by 151 days.

(21) Appl. No.: 17/340,836

(22) Filed: Jun. 7, 2021

Related U.S. Application Data

(60) Provisional application No. 63/195,203, filed on Jun. 1, 2021, provisional application No. 63/037,621, filed on Jun. 11, 2020.

(51) Int. Cl.
*H02H 7/12* (2006.01)

(52) U.S. Cl.
CPC ................... *H02H 7/1213* (2013.01)

(58) Field of Classification Search
CPC .................................................. H02H 7/1213
See application file for complete search history.

(56) References Cited

U.S. PATENT DOCUMENTS

| | | | | |
|---|---|---|---|---|
| 4,535,378 A | * | 8/1985 | Endo .................. | H02H 7/122 361/87 |
| 5,162,965 A | * | 11/1992 | Milberger ............. | H03F 3/58 361/87 |
| 2011/0096571 A1 | * | 4/2011 | Usuda .................. | H02M 3/157 363/21.1 |
| 2017/0110987 A1 | * | 4/2017 | Ghosh ................. | H02M 7/5387 |
| 2020/0235667 A1 | * | 7/2020 | Padure ................. | H02M 3/158 |

(Continued)

OTHER PUBLICATIONS

M. Fernández, X. Perpina, J. Roig-Guitart, M. Vellvehi, F. Bauwens, M. Tack, and X. Jorda, "Short-Circuit Study in Medium-Voltage GaN Cascodes, p-GaN HEMTs, and GaN MISHEMTs," IEEE Transactions on Industrial Electronics, vol. 64, No. 11, pp. 9012-9022, Nov. 2017.

(Continued)

*Primary Examiner* — Peter M Novak
(74) *Attorney, Agent, or Firm* — Michael Angert; LOZA & LOZA LLP

(57) ABSTRACT

In preferred embodiments, a short circuit protection system for a wide-band gap power electronics converter composed of multiple half-bridge legs is presented. The main approaches of the system are a single point of monitoring (SPM) for multiple switching legs, and non-invasive implementation and fast speed of the short circuit current detection. Ultra-high frequency (UHF) AC current, tens or hundreds of MHz, flowing through the DC-link capacitors represents the short circuit current occurred at the multiple switching legs. To capture the UHF AC current, a non-invasive MHz bandwidth magnetic current sensor is applied to the PCB conduction path of the converter. In this digest, simulation results of the short circuit current representation through the DC-link network and the magnetic field distribution in PCB layout for the selection of the proper location of the detection, and experimental results showing the UHF AC current sensing performance are presented.

14 Claims, 11 Drawing Sheets

(56) References Cited

U.S. PATENT DOCUMENTS

2022/0390973 A1* 12/2022 Chan .................. H02M 3/157

OTHER PUBLICATIONS

S. Mocevic, J. Wang, R. Burgos, D. Boroyevich, M. Jaksic, M. Teimor, and B. Peaslee, "Phase Current Sensor and Short-Circuit Detection Based on Rogowski Coils Integrated on Gate Driver for 1.2 kV SiC MOSFET Half-Bridge Module," in 2018 IEEE Energy Conversion Congress and Exposition (ECCE), 2018, pp. 393-400.

H. Li, X. Lyu, K. Wang, Y. Abdullah, B. Hu, Z. Yang, J. Wang, L. Liu, and S. Bala, "An Ultra-Fast Short Circuit Protection Solution for E-mode GaN HEMTs," in 2018 1st Workshop on Wide Bandgap Power Devices and Applications in Asia (WiPDA Asia), 2018, pp. 187-192.

J. Wang, Z. Shen, R. Burgos, and D. Boroyevich, "Design of a High-Bandwidth Rogowski Current Sensor for Gate-Drive Short Circuit Protection of 1.7 kV SiC MOSFET Power Modules," in 2015 IEEE 3rd Workshop on Wide Bandgap Power Devices and Applications (WiPDA), 2015, pp. 104-107.

J. Acuna, J. Walter and I. Kallfass, "Very Fast Short Circuit Protection for Gallium-Nitride Power Transistors Based on Printed Circuit Board Integrated Current Sensor," 2018 20th European Conference on Power Electronics and Applications (EPE'18 ECCE Europe), Riga, 2018, pp. P.1-P.10.

I.S. Grant and W.R. Phillips, "Electromagnetism, 2nd ed." (John Wiley & Sons, Ltd. 1990—Reprinted Mar. 2008).

A. Lauer, S. J. Nibir, M. Biglarbegian, M. Hiller and B. Parkhideh, "On Integrating Non-Intrusive Current Measurement into GaN Power Modules," 2018 IEEE 6th Workshop on Wide Bandgap Power Devices and Applications (WiPDA), Atlanta, GA, 2018, pp. 279-286.

C. Roy and B. Parkhideh, "Design Consideration for Characterization and Study of Dynamic on State Resistance of GaN Devices," 2019 IEEE 7th Workshop on Wide Bandgap Power Devices and Applications (WiPDA), Raleigh, NC, USA, 2019, pp. 181-186, doi: 10.1109/WiPDA46397.2019.8998909.

* cited by examiner

FIG. 6A  FIG. 6B

SYSTEMS AND METHODS TO MEASURE CHANGING ELECTRIC CURRENT

CROSS REFERENCE TO RELATED APPLICATIONS

This application claims priority to, and the benefit of, co-pending U.S. provisional application Nos. 63/037,621 and 63/195,203, filed on Jun. 11, 2020 and Jun. 1, 2021 respectively.

BACKGROUND OF THE INVENTION

In high frequency high power density wide-band gap (WBG) power electronics converter applications, quickly eliminating short circuit conditions from the semiconductor switch network is one of the main reliability issues regarding device failure and degradation. Many WBG short circuit protections target a single device or a single half-bridge switching leg. As a result, power electronics converters composed of multiple semiconductor switching legs require more than one short circuit protection circuit, which may increase system cost and maintenance issues. Besides, those methods are invasive, which need modification or redesign of hardware system to be applied.

BRIEF SUMMARY OF THE INVENTION

A short circuit protection system for a wide-bandgap power electronics converter composed of multiple half-bridge legs is presented. A single point of monitoring (SPM) for multiple switching legs, and implementation of a non-invasive and ultra-fast short circuit current detection apparatus are presented. Ultra-high frequency (UHF) alternating current (AC), tens or hundreds of MHz, flowing through the DC-link capacitors represents the short circuit current occurred at the multiple switching legs. To capture the UHF AC current, a non-invasive MHz bandwidth magnetic current sensor is applied to the PCB conduction path of the converter. Simulation results of the short circuit current representation through the DC-link network and the magnetic field distribution in PCB layout for the selection of the proper location of the detection, and experimental results showing the UHF AC current sensing performance are presented herein.

BRIEF DESCRIPTION OF THE DRAWINGS

FIG. 6A is a schematic diagram of a double pulse tester according to some aspects of the disclosure.

FIG. 6B is an artist's rendering of a physical implementation of the double pulse tester of FIG. 6A according to some aspects of the disclosure.

DETAILED DESCRIPTION AND BEST MODE OF IMPLEMENTATION

Figure 1:
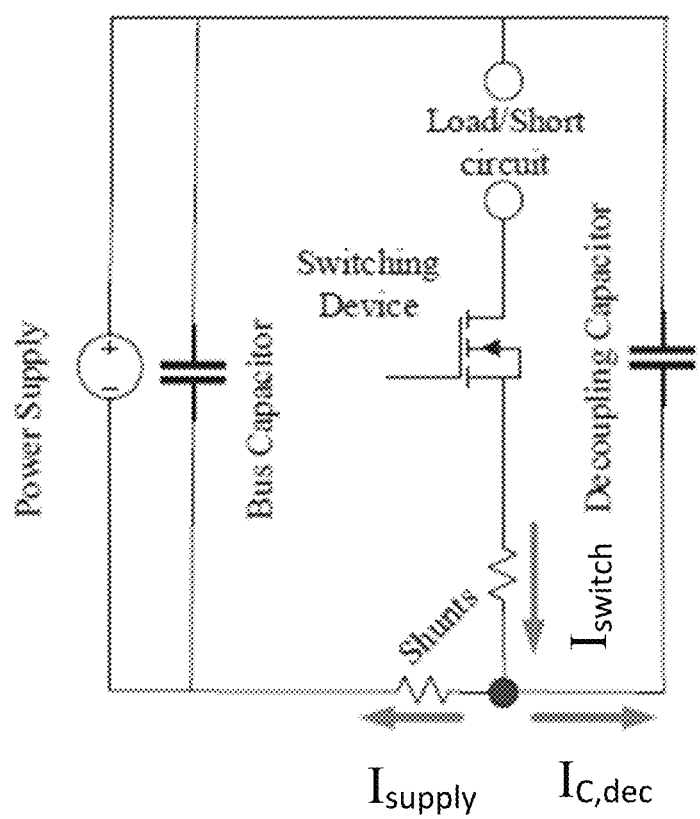
FIG. 1 is a schematic diagram illustrating a circuit including a wide-bandgap (WBG) semiconductor transistor switch network and a decoupling capacitor according to some aspects of the disclosure.

This paper presents a novel short circuit protection strategy for a wide-band gap power electronics converter composed of multiple half-bridge legs. The main approaches of the proposed strategy are a single point of monitoring (SPM) indicating the short circuit events occurred in a multiple switching legs and a non-invasive implementation of an ultra-fast short circuit current detection strategy. Ultra-high frequency (UHF) AC current, tens or hundreds of MHz, flowing through the decoupling capacitor represents the short circuit current flowing through the multiple switching legs. To capture the UHF AC current, a non-invasive MHz bandwidth magnetic current sensor is applied to the PCB conduction path of the converter. In this paper, simulation results of the short circuit current representation through the DC-link network, especially through DC capacitors, a non-invasive approach for the measurement of the decoupling capacitor current, and experimental results showing the UHF AC current sensing performance are presented.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figures referred to in this document may refer to figures from the provisional applications referenced above and incorporated herein by reference.

In high frequency and high power density wide-band gap (WBG) power electronics converter applications, quickly eliminating a short circuit conditions from a semiconductor switch network is one of the main reliability issues regarding device failure and degradation. Many WBG short circuit protections target a single device or a single half-bridge switching leg. As a result, power electronics converters composed of multiple semiconductor switching legs require more than one short circuit protection circuit, which may increase system costs and maintenance issues. Besides, those methods are invasive, which needs modification or redesign of hardware system to be applied.

An effective solution for short circuit protection of a WBG power electronics converter composed of multiple half-bridge switching legs is described. The principles of the strategy described are achieving the short circuit current detection function with a single point of monitoring (SPM) and improving the detection speed by adopting an ultra-fast current sensor.

FIG. 1 is a schematic diagram illustrating a circuit 100 including a wide-bandgap (WBG) semiconductor transistor switch network 101 and a decoupling capacitor 122 ($C_{Decoupling}$) according to some aspects of the disclosure. The circuit 100 includes a first rail 102 (e.g., an upper rail, a positive DC bus rail) and a second rail 104 (e.g., a lower rail, a negative DC bus rail). The WBG semiconductor switch network 101 is coupled across the first rail 102 and the second rail 104. The WBG semiconductor switch network 101 includes a first WBG transistor 106 in series with a second WBG transistor 108. The first WBG transistor 106 and the second WBG transistor 108 form a first half-bridge switch leg 110. The WBG semiconductor switch network 101 also includes a third WBG transistor 112 in series with a fourth WBG transistor 114. The third WBG transistor 112 and the fourth WBG transistor 114 form a second half-bridge switch leg 116. The first half-bridge switch leg 110 and the second half-bridge switch leg 116 are coupled in parallel and together form a full-bridge 118. A decoupling link conduction path 120 formed of a first decoupling conduction path 120a and a second decoupling conduction path 120b and the decoupling capacitor 122 in series therebetween. The decoupling link conduction path 120 is coupled across the first rail 102 and the second rail 104, in parallel with the WBG semiconductor switch network 101. A WBG semiconductor switch network, similar to the WBG semiconductor switch network 101, may be included as a full-bridge of a high frequency high power density WBG power electronics converter, for example. A non-invasive single point of monitoring 124 is associated with the decoupling capacitor 122.

The single point of monitoring 124 of the short circuit current is enabled by measuring ultra-high frequency (UHF) AC current, tens or hundreds of MHz, discharged from the decoupling capacitor. The decoupling capacitor is the main source of the short circuit current in the initial phase, which ranges a couple of hundreds of nanoseconds, due to the closest location to the switching network, low line impedance, and fast discharging capability. The contribution of the decoupling capacitor to the short circuit current is dominant compared to the DC bus capacitor or the DC power source.

Figure 2A:
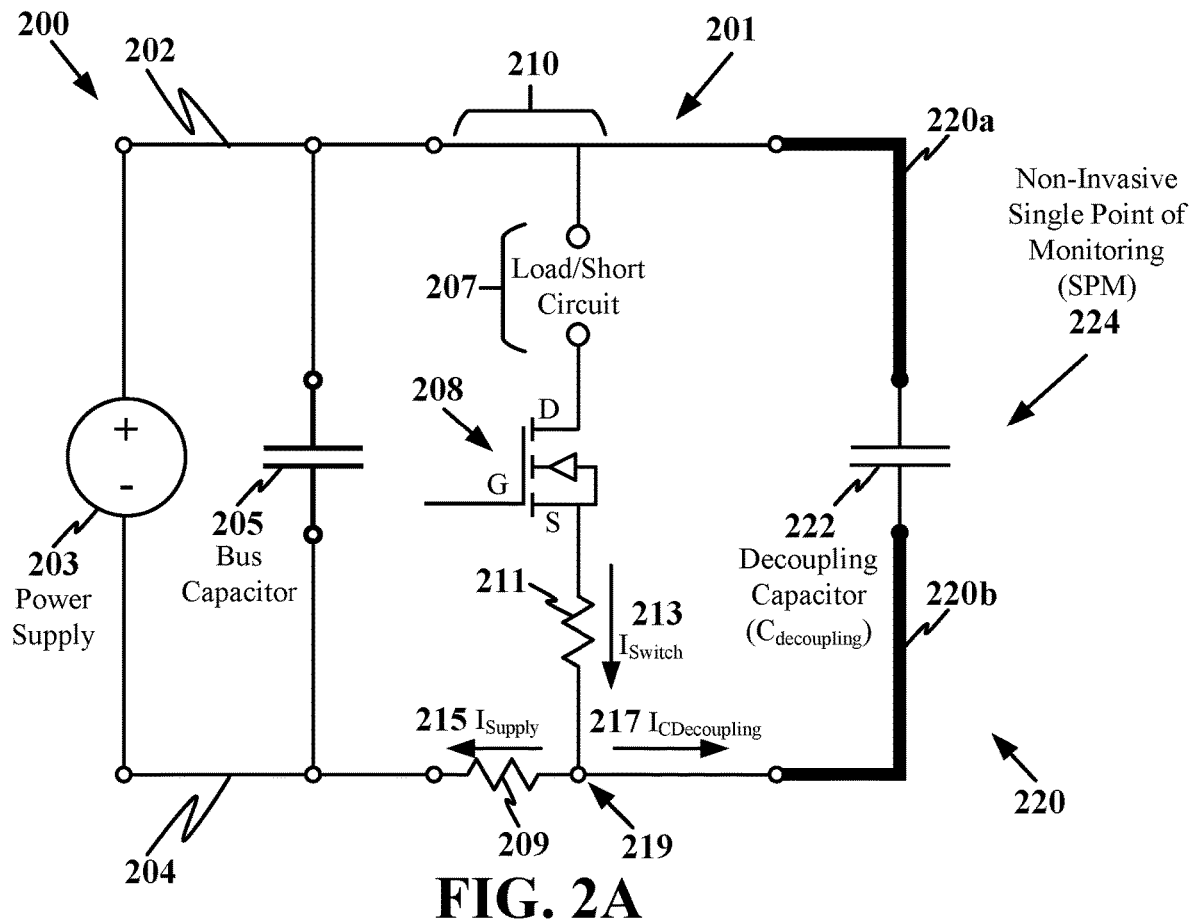
FIG. 2A is a schematic diagram of a circuit utilized to measure decoupling capacitor current according to some aspects of the disclosure.
Figure 2B:
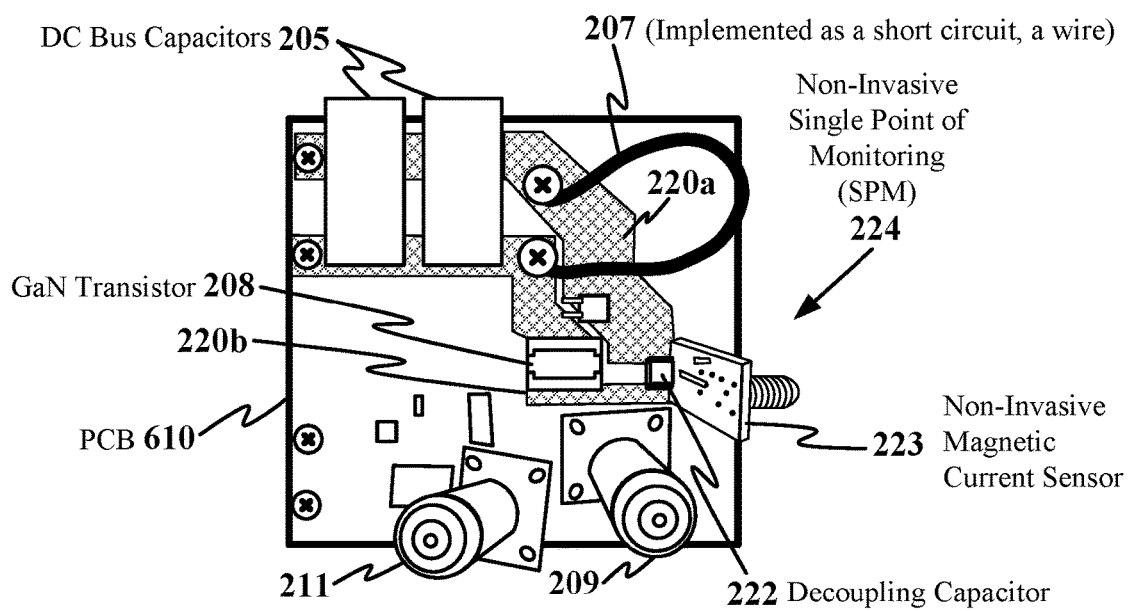
FIG. 2B is an artist's rendition of a physical implementation of the schematic diagram of the circuit of FIG. 2A.

FIG. 2A is a schematic diagram of a circuit 200 utilized to measure decoupling capacitor 222 current according to some aspects of the disclosure. FIG. 2B is an artist's rendition of a physical implementation of the schematic diagram of the circuit 200 of FIG. 2A. The physical implementation illustrated in FIG. 2B is sometimes referred to as a "fault circuit detection setup." Utilizing the fault circuit detection setup, the decoupling capacitor 222 current may be measured using an invasive method involving a first resistor 209 and a second resistor 211 (i.e., representing two points of monitoring), and/or a non-invasive method involving a non-invasive magnetic current sensor 223 (FIG. 2B) at a single point of monitoring (SPM) 224. The non-invasive magnetic current sensor 223 developed is based on a coil network.

The circuit 200 includes a first rail 202 (e.g., an upper rail, a positive DC bus rail) and a second rail 204 (e.g., a lower rail, a negative DC bus rail). A power supply 203 and a DC bus capacitor 205 are coupled in parallel across the first rail 202 and the second rail 204. The circuit 200 also includes a wide-bandgap (WBG) semiconductor transistor switch network 201, and a decoupling capacitor 222 ($C_{Decoupling}$) according to some aspects of the disclosure. Although the WBG semiconductor transistor switch network 101 as shown and described in connection with FIG. 1 could be utilized in the circuit 200 of FIG. 2A, for ease of experimentation, the WBG semiconductor transistor switch network 201 of FIG. 2A is represented as one WBG transistor 208 in series with a pair of terminals 207. As indicated in FIG. 2A, a load or a short circuit (neither shown in FIG. 2A) could be alternatively coupled across the pair of terminals 207. The WBG semiconductor transistor switch network 201 may form or represent a half-bridge switch leg 210. The load (not shown) coupled across the terminal pair 207 may emulate a second WBG transistor in an off state. The short (e.g., a piece of wire as shown in FIG. 2B) coupled between the terminals of the terminal pair 207 may emulate the second WBG transistor in a short circuit condition.

According to one example of an invasive current measuring method and apparatus and based on the circuit configuration including the first resistor 209 and the second resistor 211 as shown and described in connection with FIG. 2A, the decoupling capacitor 222 current can be found using equation 1, below:

$$I_{switch} - I_{Supply} = I_{CDecoupling} \quad (1)$$

where:

$I_{CDecoupling}$ 217 indicates the current flowing through the decoupling capacitor 222, $I_{switch}$ 213 indicates the current flowing through the switching transistor (i.e., the WBG transistor 208) and therefore through the second resistor 211, and $I_{supply}$ 215 indicates the current flowing toward the power supply 203 and bus capacitor 205 (represented in FIG. 2B as a parallel pair of two capacitors) and therefore through the first resistor 209.

The circuit 200 also includes the aforementioned first resistor 209 and second resistor 211 (also referred to as shunt resistors herein) that may be utilized in an invasive manner to measure current (inferred from a voltage drop across the terminals of the respective resistors) for purposes of experimentation. The first resistor 209 has a first terminal and a second terminal and is coupled in series with the second rail 204. The first terminal is coupled to the negative terminal of the DC power supply 203 and the bus capacitor 205. The second resistor 211 has a third terminal and a fourth terminal. The third terminal is coupled to the source terminal of the WBG transistor 208 and the fourth terminal is coupled to a common node 219 that is coupled to the second terminal of the first resistor 209. Switch current 213 ($I_{switch}$) may flow through the first resistor 209 from the WBG transistor 208 toward the common node 219. Supply current 215 ($I_{supply}$) may flow through the second resistor 211 from the common node 219 toward the power supply 203 and bus capacitor 205. Decoupling current 217 ($I_{CDecoupling}$) may flow from the common node 219 through the decoupling capacitor 222 and toward the first rail 202 thereafter.

To capture the UHF AC current, a MHz bandwidth magnetic current sensor (MCS) is applied to the decoupling capacitor conduction path. Due to the capability of the current sensor representing the UHF AC current magnitude, the current sensing circuit does not include an integrator, which causes an unwanted time delay in the entire detection process. Besides, due to the non-invasive structure of the MCS, a proper location of the sensor placement on the PCB layout is an important consideration of the protection system design.

Feasibility and effectiveness of the short circuit current detection through the decoupling capacitor current and the nanoseconds-range fast rising current measurement using the non-invasive MHz bandwidth MCS are demonstrated and verified through computational simulations and experimental results presented herein. Experimental demonstrations with the manufactured short circuit protection evaluation board and the optimized non-invasive MHz bandwidth MCS will be presented, and their detailed analysis and evaluation of the proposed strategy will be provided.

Single Point Monitoring of Short Circuit Condition

In a short circuit event, the current through the semiconductor switches rises to a very large magnitude compared to the steady state current in a very short period of time. time. The main cause of this short-circuit current is the low switching loop impedance composed of line, parasitic, and fault impedances with the energy sources including DC power supplies and energy storage components. The rate of current rise through WBG semiconductor switches, especially through GaN devices, is even faster because of their fast turn on capability compared to Si based semiconductor devices. While GaN power devices can switch faster than Si and SiC, the short circuit withstand capability of GaN transistors can be as low as couple of hundred nanoseconds. As a result, GaN power electronics converters require much faster short-circuit protection capability within a few nanoseconds. Immediately after a short circuit event, the short circuit current does not come from the DC power source, rather it comes from the decoupling capacitor for first couple of hundred nanoseconds and the DC bus bulk capacitor's contribution to the short circuit current becomes significant after couple of hundred nanoseconds. The contribution from the DC source becomes significant microseconds after the short circuit event.

Figure 3:
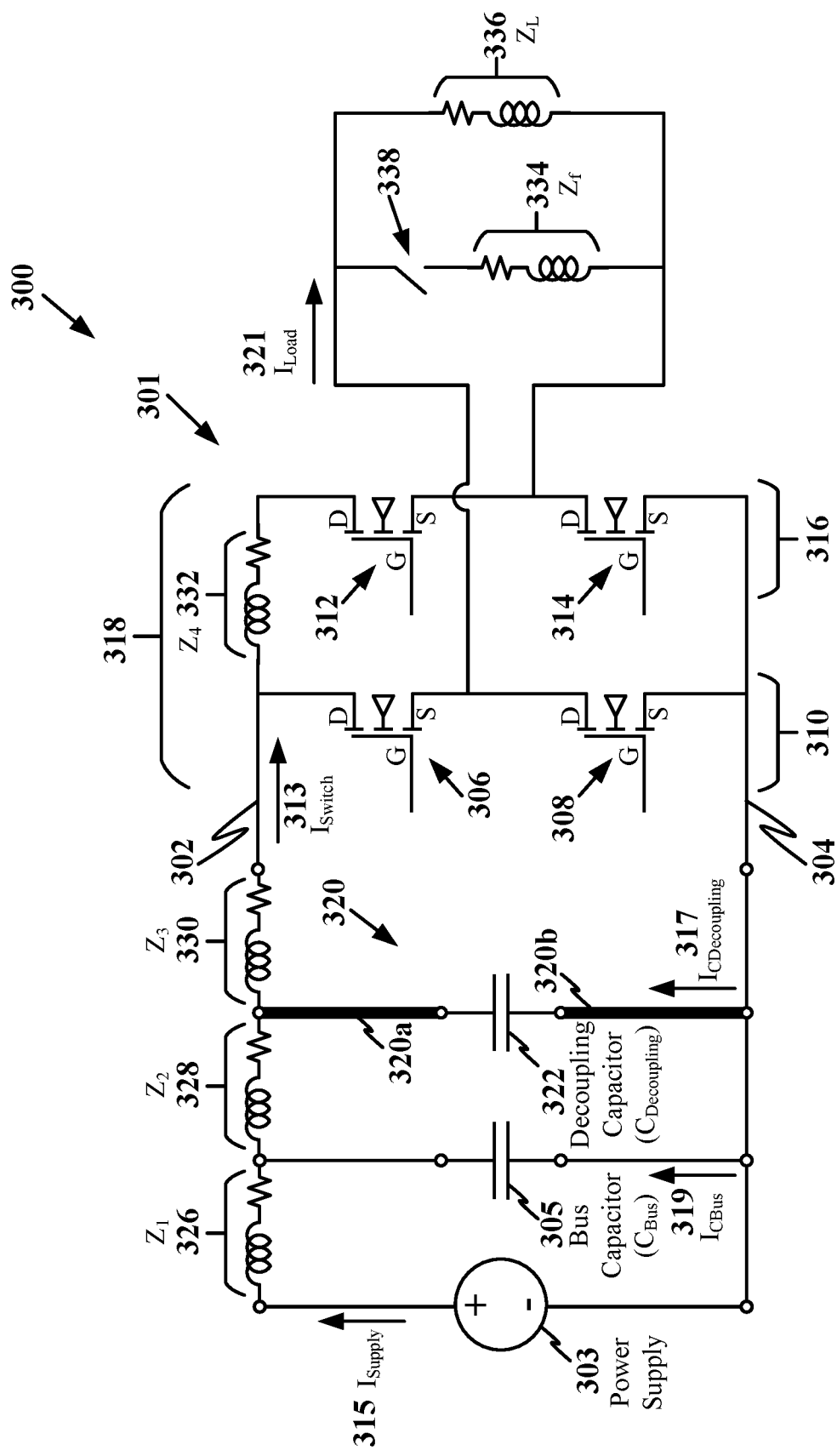
FIG. 3 is an electrical schematic diagram of a circuit used to simulate a short circuit event in a full-bridge configuration according to some aspects of the disclosure.

FIG. 3 is an electrical schematic diagram of a circuit 300 used to simulate short circuit event in a full bridge configuration (e.g., such as, but not limited to, the full-bridge 118 as shown and described in connection with FIG. 1) according to some aspects of the disclosure. The parasitic elements of the components represented in FIG. 3 (i.e., $Z_1$ 326, $Z_2$ 328, $Z_3$ 330, $Z_4$ 332, $Z_f$ 334, and $Z_L$ 336) were estimated using impedance calculator of PCB layout tools, for standard PCB layout. The impedance of the parasitic elements and their relationship to the components represented in FIG. 3, are presented in Table 1. Table 1 also presents the capacitance of the DC bus capacitor 305 ($C_{Bus}$) and the decoupling capacitor 322 ($C_{Decoupling}$). The impedances of the respective parasitic elements are represented in FIG. 3 as a series combination of an inductor and a resistor. The parallel combination of the fault parasitic elements 334 $Z_f$ and load parasitic elements 336 $Z_L$ are coupled to a first half-bridge switch leg 310 and a second half-bridge switch leg 316, as shown. A switch 338 is in series with the fault parasitic elements 334 $Z_f$, as shown.

TABLE 1

Parameters of the Circuit Components Including Parasitic Elements in the Simulation

| Component Designator | Value | Description |
|---|---|---|
| $Z_1$ 326 | 100 mΩ, 200 nH | DC source to DC bus impedance |
| $Z_2$ 328 | 10 mΩ, 20 nH | DC bus capacitor to Decoupling capacitor impedance |
| $Z_3$ 330 | 1 mΩ, 10 nH | Switching loop impedance in the decoupling capacitor and switch loop |
| $Z_4$ 332 | 1 mΩ, 10 nH | Impedance between the two half-bridge legs |
| $Z_f$ 334 | 1 mΩ, 10 nH | Fault impedance |
| $Z_L$ 336 | 10 mΩ, 1 µH | Load |
| $C_{Bus}$ 305 | 9.2 µF | Bus capacitance |
| $C_{Decoupling}$ 322 | 2.2 µF | Decoupling capacitance |

The circuit 300 includes a first rail 302, a second rail 304, a WBG semiconductor switch network 301 including a first WBG transistor 306 and a second WBG transistor 308 forming a first half-bridge switch leg 310, a third WBG transistor 312 and a fourth WBG transistor 314 forming a second half-bridge switch leg 316 (collectively forming a full bridge 318), a decoupling link conduction path 320 formed of a first decoupling conduction path 320a and a second decoupling conduction path 320b with a decoupling capacitor 322 ($C_{Decoupling}$) in series therebetween all as similarly shown and described in connection with the circuit 100 of FIG. 1. The circuit 300 also includes a power supply 303 and a DC bus capacitor 305 all as similarly shown and described in connection with the circuit 200 of FIG. 2A. For the sake of brevity and to avoid repetition, the detailed descriptions of the components of the circuit 300 will not be repeated.

Figure 4B:
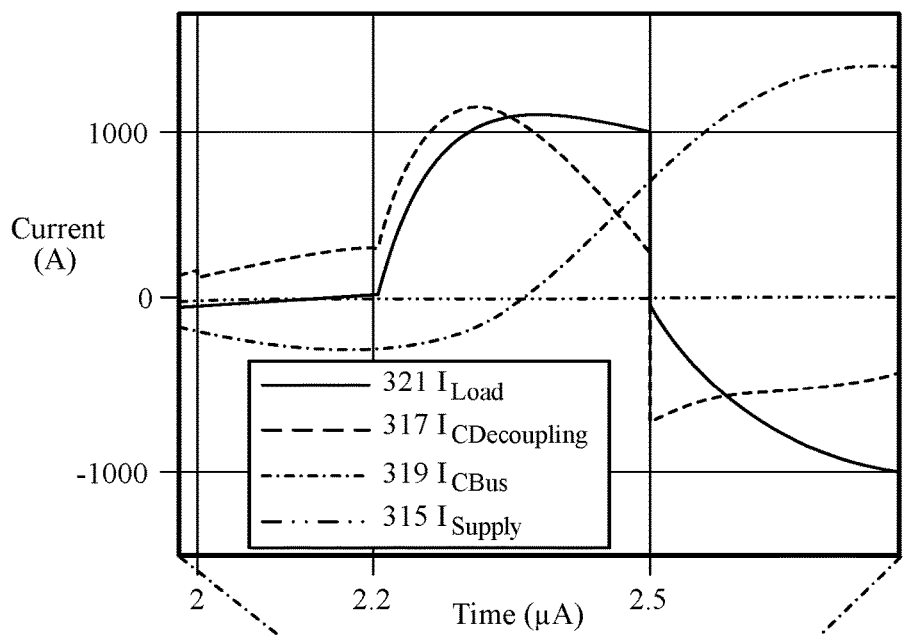
FIG. 4B is a zoomed-in portion of the simulation results of FIG. 4A.
Figure 4A:
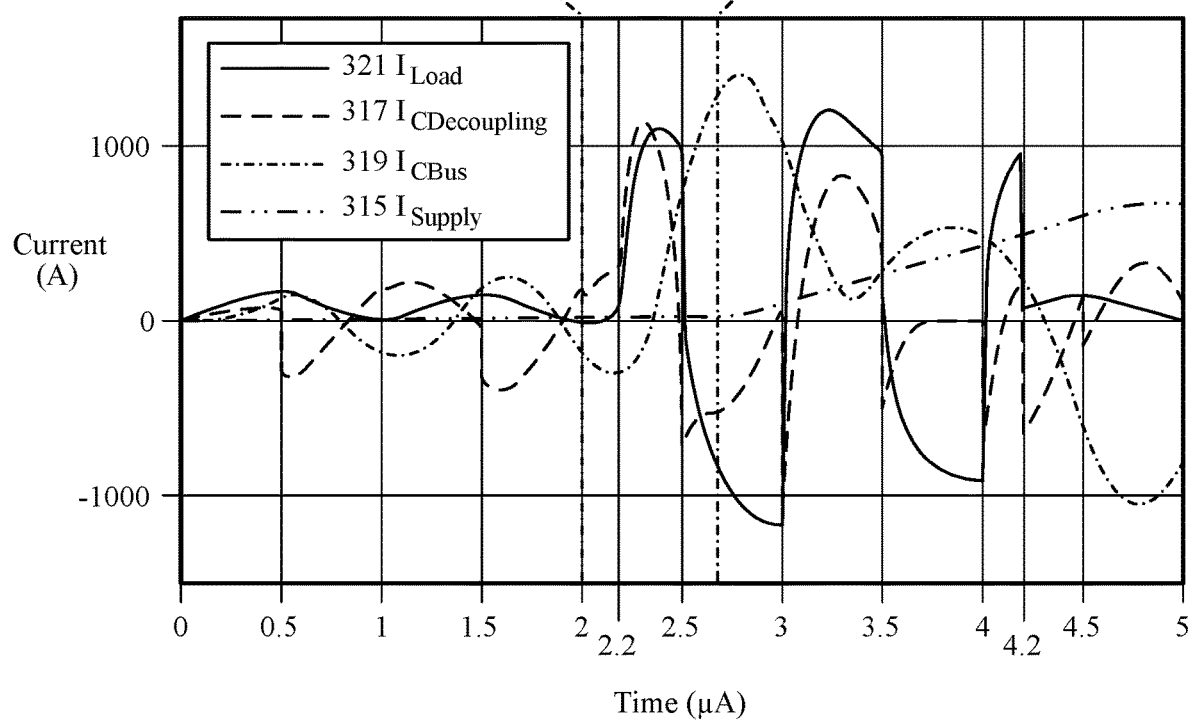
FIG. 4A is a graphical depiction of simulation results according to some aspects of the disclosure.

FIG. 4A is a graphical depiction of simulation results according to some aspects of the disclosure. FIG. 4B is a zoomed-in portion of the simulation results of FIG. 4A. The simulation was based on the circuit 300 of FIG. 3. Simulation results show that the decoupling capacitor is the main contributor to the short circuit capacitor for the first 100 ns after the short circuit event. Therefore, the detection of short circuit is enabled by placing only one sensor that can detect the current through the decoupling capacitor. FIGS. 4A and 4B present the load current 321 ($I_{Load}$), the decoupling capacitor current 317 ($I_{CDecoupling}$), the bus capacitor current 319 ($I_{CBus}$), and the power supply current 315 ($I_{Supply}$).

PCB Layout Structure of WBG Power Electronics Converter and Location of Short-Circuit Current Detection To obtain optimum performance in power electronic circuits, the switching loop containing the semiconductor switches and the decoupling capacitor needs to be optimized. Depending on the layout, it is possible to find a location where the magnetic field due to the transient short circuit current is maximum. As the decoupling capacitor is the primary contributor to the short circuit, this location is the switching loop containing the decoupling capacitor and the semiconductor switches.

Figure 5A:
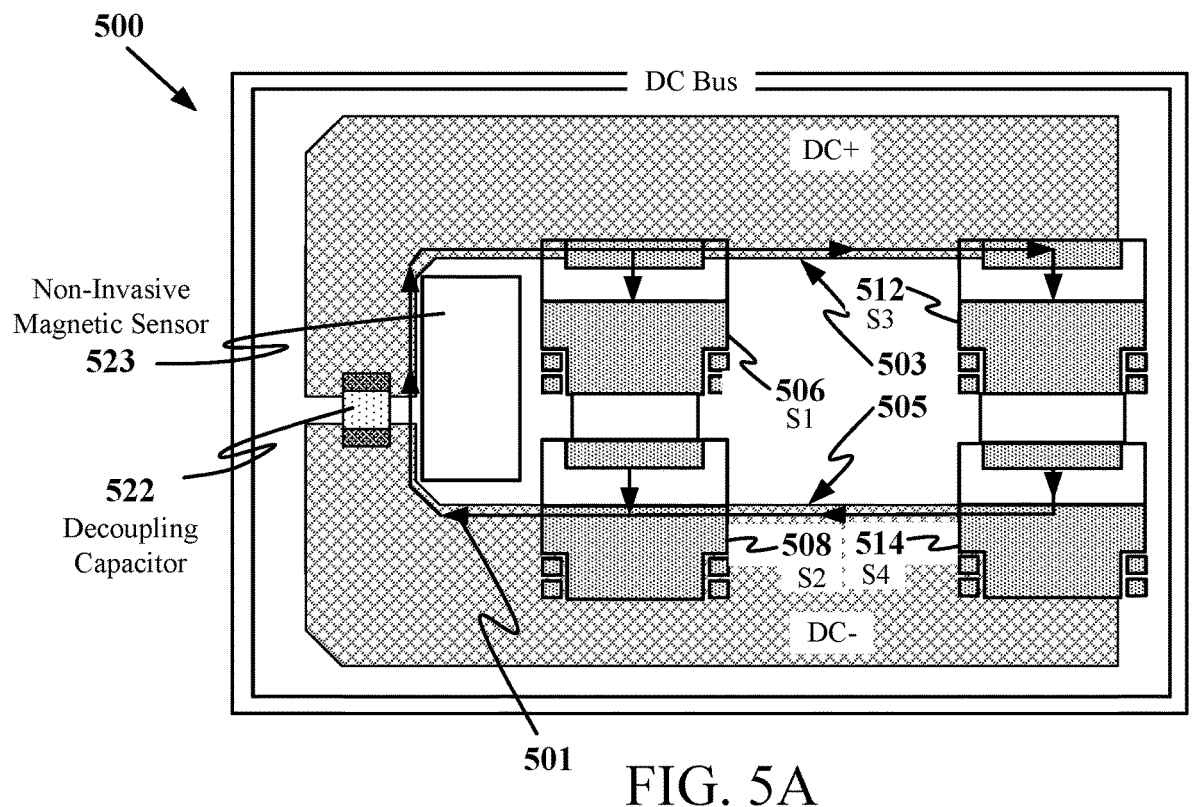
FIG. 5A presents an example of a full-bridge containing four semiconductor switches and a decoupling capacitor according to some aspects of the disclosure.

FIG. 5A presents an example of a full bridge 500 containing four semiconductor switches (a first switch 506 (S1), a second switch 508 (S2), a third switch 512 (S3), a fourth switch 514 (S4),) and a decoupling capacitor 522 according to some aspects of the disclosure. According to some aspects, the first switch 506 (S1) may correspond to a first WBG transistor such as the first WBG transistor 106, 306 of FIGS. 1, 3A, respectively. According to some aspects, the second switch 508 (S2) may correspond to a second WBG transistor such as the second WBG transistor 108, 308 of FIGS. 1, 3A, respectively. According to some aspects, the third switch 512 (S3) may correspond to a third WBG transistor such as the third WBG transistor 112, 312 of FIGS. 1, 3A, respectively. According to some aspects, the fourth switch 514 (S4) may correspond to a fourth WBG transistor such as the fourth WBG transistor 114, 314 of FIGS. 1, 3A, respectively. Solid-line arrows show the short circuit transient current path illustrating a general clockwise rotation. As the high frequency transient current flows near the edge of the respective copper traces 503, 505 of the positive DC bus and the negative DC bus, respectively, the short circuit current can be estimated from the magnetic field near the decoupling capacitor 522.

Figure 5B:
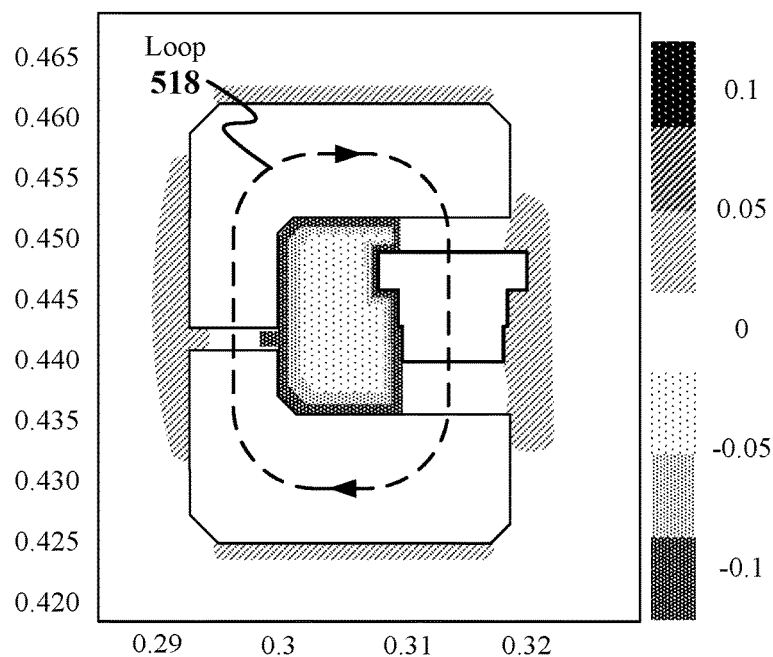
FIG. 5B presents the magnetic field due to a 100 A 50 MHz current through a switching loop consisting of the decoupling capacitor and the closest half-bridge switch leg according to some aspects of the disclosure.

FIG. 5B presents the magnetic field due to a 100 A 50 MHz current through the switching loop 518 consisting of the decoupling capacitor 522 and the closest half bridge (formed of the first switch 506 and the second switch 508) according to some aspects of the disclosure. As the current is flowing counterclockwise, the magnetic field inside the switching loop 518 is into the surface therefore it is negative. For this layout the best location for a single detector (the non-invasive magnetic current sensor 523) is marked in the figure (FIG. 5A, non-invasive magnetic current sensor 523). Optimized non-invasive magnetic current sensor location will be presented for other layout configurations.

Experimental Results

Figure 6C:
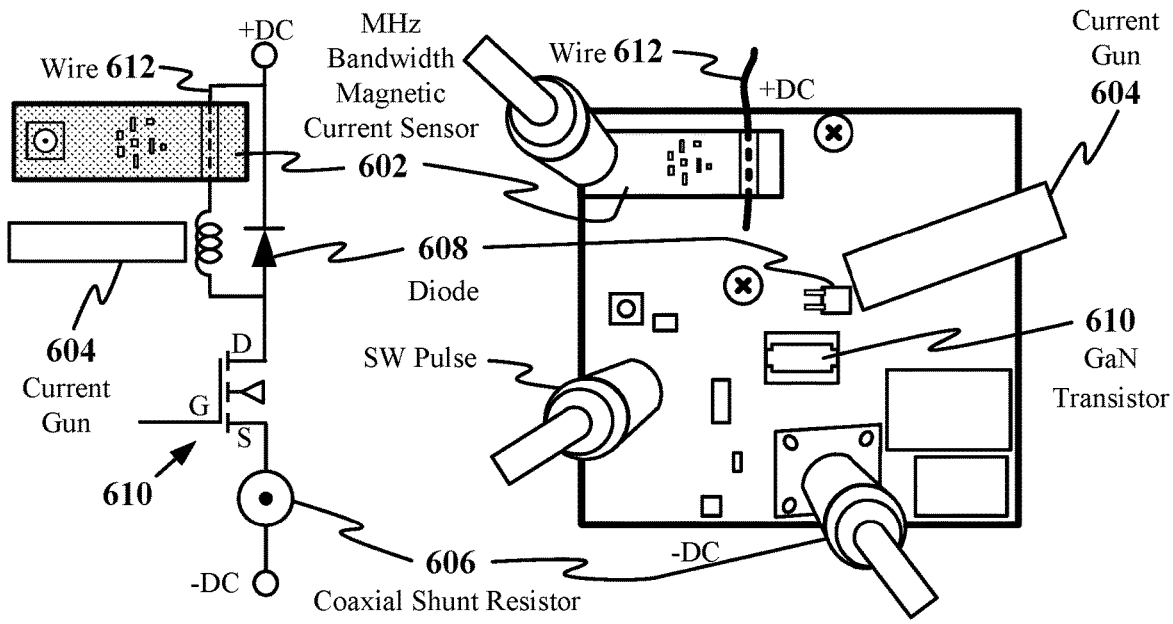
FIG. 6C is a graph illustrating the outputs of a MHz bandwidth magnetic current sensor, a current gun, and a coaxial shunt resistor 606 according to some aspects of the disclosure.
Figure 6C:
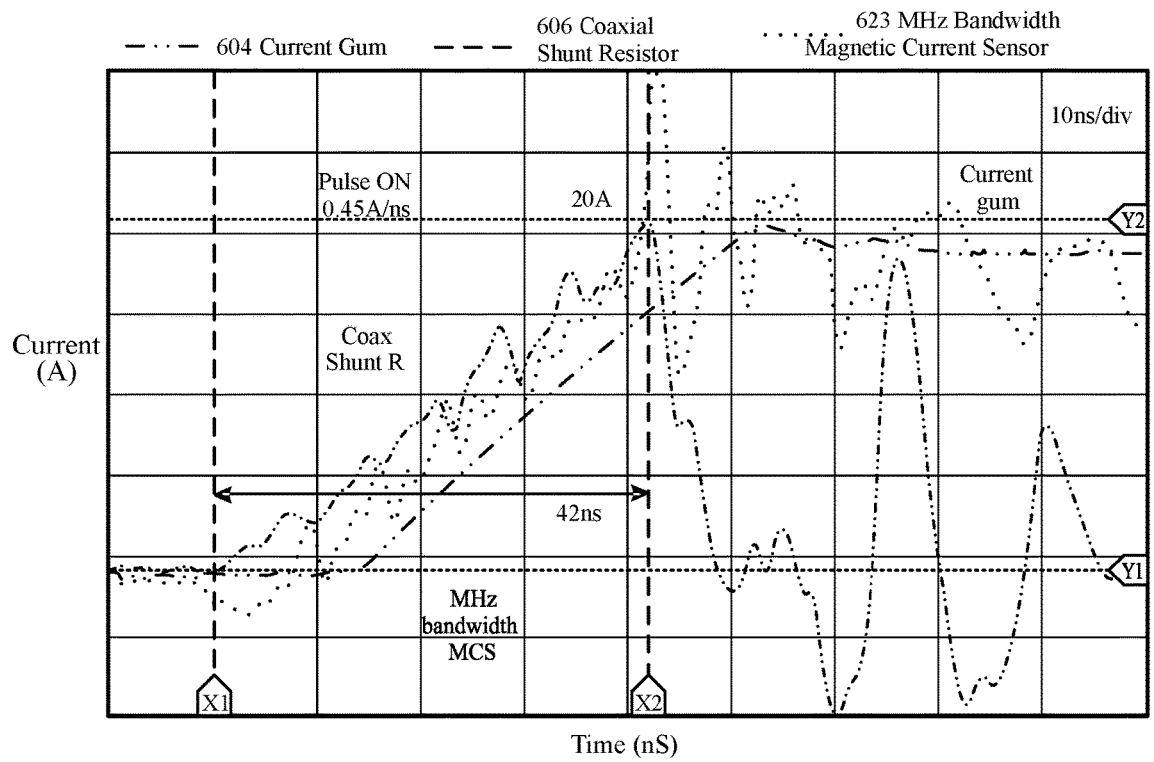

FIG. 6A is a schematic diagram of a double pulse tester 600 according to some aspects of the disclosure. FIG. 6B is an artist's rendering of a physical implementation of the double pulse tester 600 of FIG. 6A according to some aspects of the disclosure. FIG. 6C is a graph illustrating the outputs of a MHz bandwidth magnetic current sensor 602, a current gun 604, and a coaxial shunt resistor 606 (similar to the first resistor 209 as shown and described in connection with FIG. 2A) according to some aspects of the disclosure.

In short circuit protection, fast and precise current measurement is one of the key processes. In WBG power electronics converter applications, the rise time of the short circuit current ranges in the tens or hundreds of nanoseconds: UHF AC current. For UHF AC current measurement, a MHz bandwidth MCS 602 is used, which senses magnetic field changes in the switching loop (e.g., the switching loop 518 as shown and described in connection with FIG. 5B) and presents it as the AC current magnitude. To verify the short circuit current measurement performance, first, a fast-rising current is generated by using a double pulse tester 600 composed of a SiC Schottky diode 608 and a GaN transistor 610. In order to emulate the switch current waveform of turn-on transition, a short wire 612 is connected to the double pulse tester instead of an inductor, as shown in FIG. 6A. This direct wire connection provides the minimum inductance, which is the switching loop inductance of the switching leg, to the double pulse tester circuit and increases the ramp-rate of the rising current, 20 A/42 ns. The comparison of different current measurement methods is conducted by using 1) MHz bandwidth MCS 602, 2) coaxial shunt resistor 606, and 3) DC current probe. Detailed parameters and information of the experiment test setup are presented in Table 2.

TABLE 2

Parameters of Experiment Conditions and Results

| Description | Condition or Result |
| --- | --- |
| DC input voltage | 65 V |
| Switching pulse | 1 MHz, 3% duty ratio |
| Inductor | Direct wire connection |
| GaN transistor | IGOT60R070D1 |
| SiC Schottky diode | C3D08065E |
| Ramp-rate of rising current | 20 A/42 ns |
| Current measurements | Coaxial shunt resistor (49.71 mΩ), DC current probe (50 A, 50 MHz), MHz bandwidth magnetic current sensor |

During the rising time, the coaxial shunt resistor 606 output shows the fastest measurement response due to its resistance characteristics, and the MCS 602 output follows the waveform of the coaxial shunt resistor 606 output with 6 ns delay in the middle point and zero delay at the peak, as shown in FIG. 6C. Since the coaxial shunt resistor 606 requires circuit modification to be applied to the converter circuit and causes lower system efficiency with its voltage drop and ground floating issues, the non-invasive MCS 602 is selected for the proposed short circuit protection strategy. Detail design of the MCS 602 and the experimental results of the short circuit current measurement using the MCS 602 will be provided.

In some aspects, an ultra-fast short circuit protection strategy has been presented for GaN based high frequency power converter. Because of the very fast turn on behavior of GaN power transistors, the short circuit current rise rate is very high. This fast-rising current does not come from the power supply, rather it is supplied primarily from the decoupling capacitor (e.g., decoupling capacitor 122, 222, 322, 522 as shown and described in connection with FIGS. 1, 2, 3, and 5A, respectively) for the first couple of hundred nanoseconds. Therefore, a single point of monitoring (SPM) near the decoupling capacitor is proposed for the short circuit protection of multiple switching legs, and a MHz bandwidth MCS has been developed to capture the transient short circuit current. The concept that the transient short circuit current comes from the decoupling capacitor has been proven from simulation. The high bandwidth MCS has been tested in a 20 A/42 ns fast rising current. Short circuit detection using the developed MCS is presented along with the short circuit clearing strategies.

Herein are described a novel short-circuit monitoring strategy that is suitable for power electronics converters composed of multiple WBG semiconductor devices and half-bridge switch legs, such as full-bridge single or three phase direct current to alternating current (DC/AC) inverters. The proposed strategy is a single point of measurement (SPM) method that monitors only a single system parameter as a short-circuit condition indicator for multiple semiconductor switches. The main approach of the proposed SPM method is monitoring the decoupling capacitor current. Immediately after a short circuit event occurs, the short circuit current does not come from the DC power supply, rather it initially comes from the energy storage devices close to the short circuit path. In most of power electronics converters, especially operating at high switching frequencies, the closest energy storage component to the device short circuit path is the decoupling capacitor. Therefore, a significant amount of initial short circuit current comes from the decoupling capacitor. In the meantime, the direct current (DC) bus bulk capacitor, which is the second closest energy storage component having higher parasitic impedance than the decoupling capacitor, starts to discharge contributing to the short circuit current gradually. After a couple of hundred nanoseconds, the DC bus bulk capacitor's contribution to the short circuit current becomes significant since small capacitance of the decoupling capacitor is not enough to cover the entire short circuit current, which keeps increasing while the short circuit is maintained. Likewise, the contribution from the DC power supply is the slowest due to its farthest location, high line impedance, and its inherent slow ramp-rate characteristics.

Figure 7:
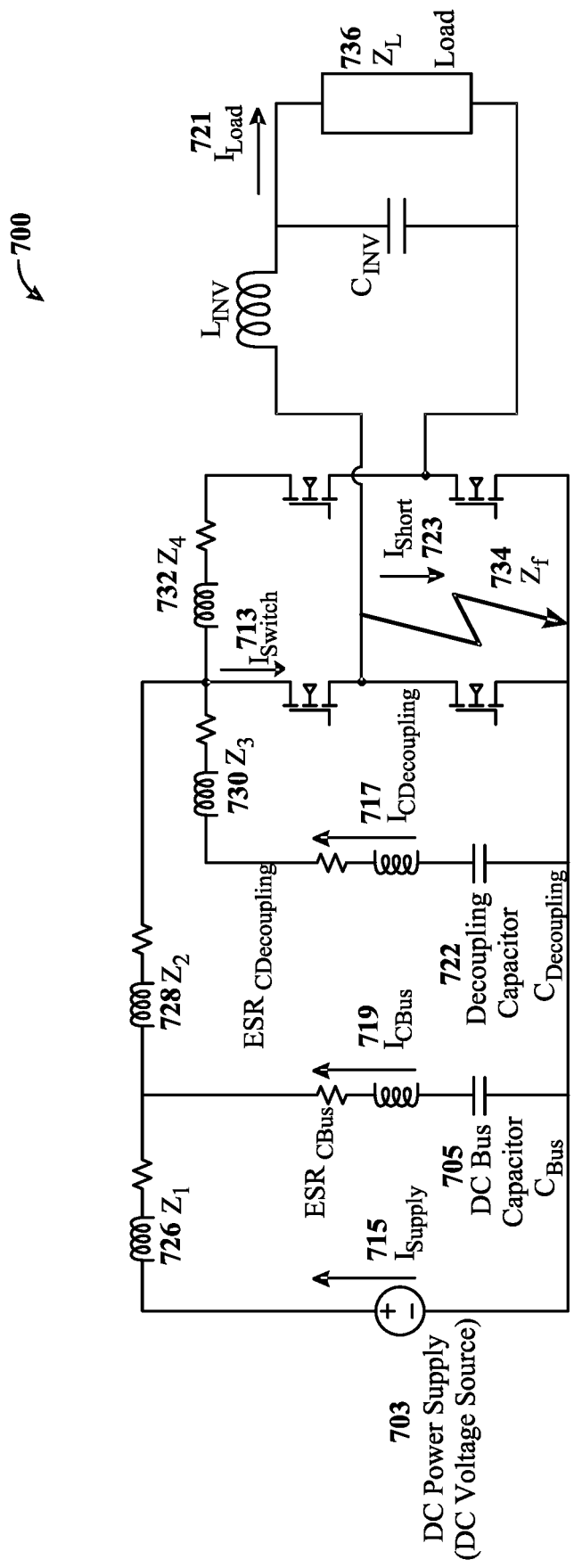
FIG. 7 is an electrical schematic diagram of a single-phase inverter circuit under a line-to-ground short circuit fault condition considering parasitic elements according to some aspects of the disclosure.

FIG. 7 is an electrical schematic diagram of a single-phase inverter circuit 700 under a line-to-ground short circuit fault condition considering parasitic elements according to some aspects of the disclosure. The circuit 700 is used to simulate a short circuit event in a full-bridge configuration. The components of the circuit 700 are similar to the components of the circuit 300 as shown and described in connection with FIG. 3; their descriptions will not be repeated for the sake of brevity and to avoid repetition.

Figure 8B:
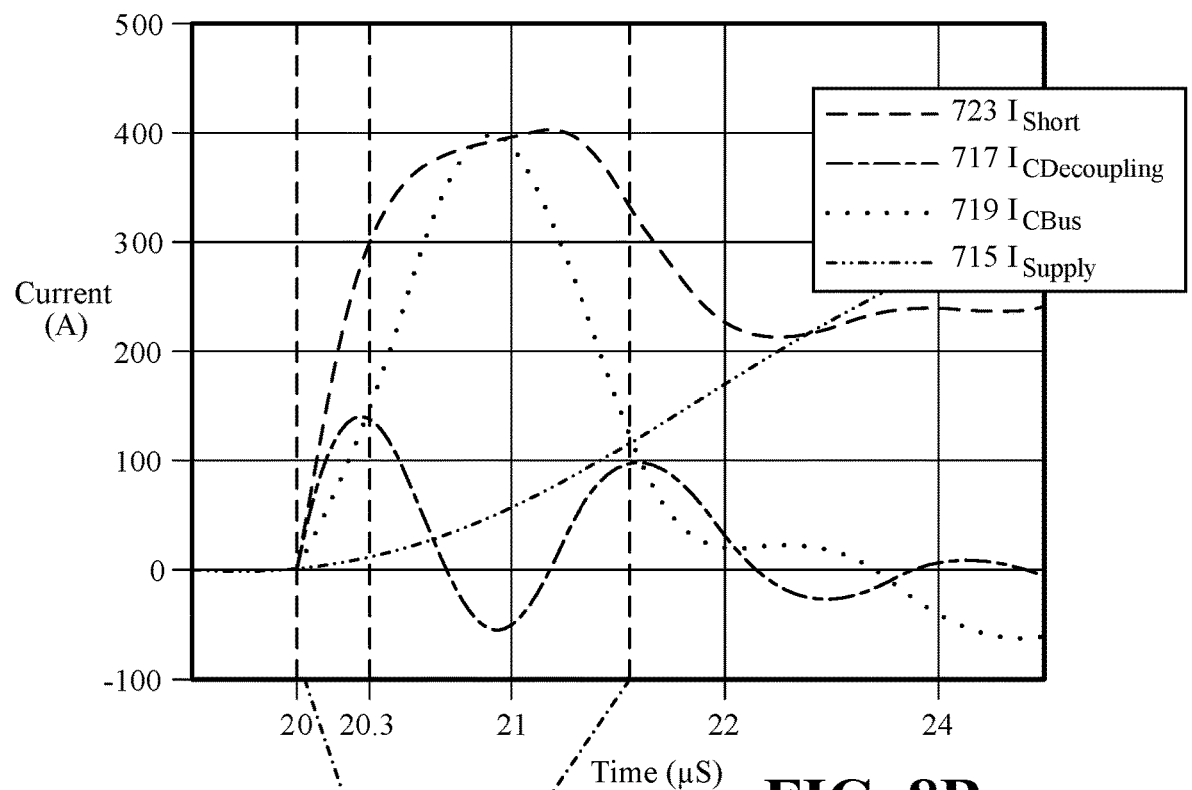
FIG. 8B is a zoomed-in portion of the simulation results of FIG. 8A.
Figure 8A:
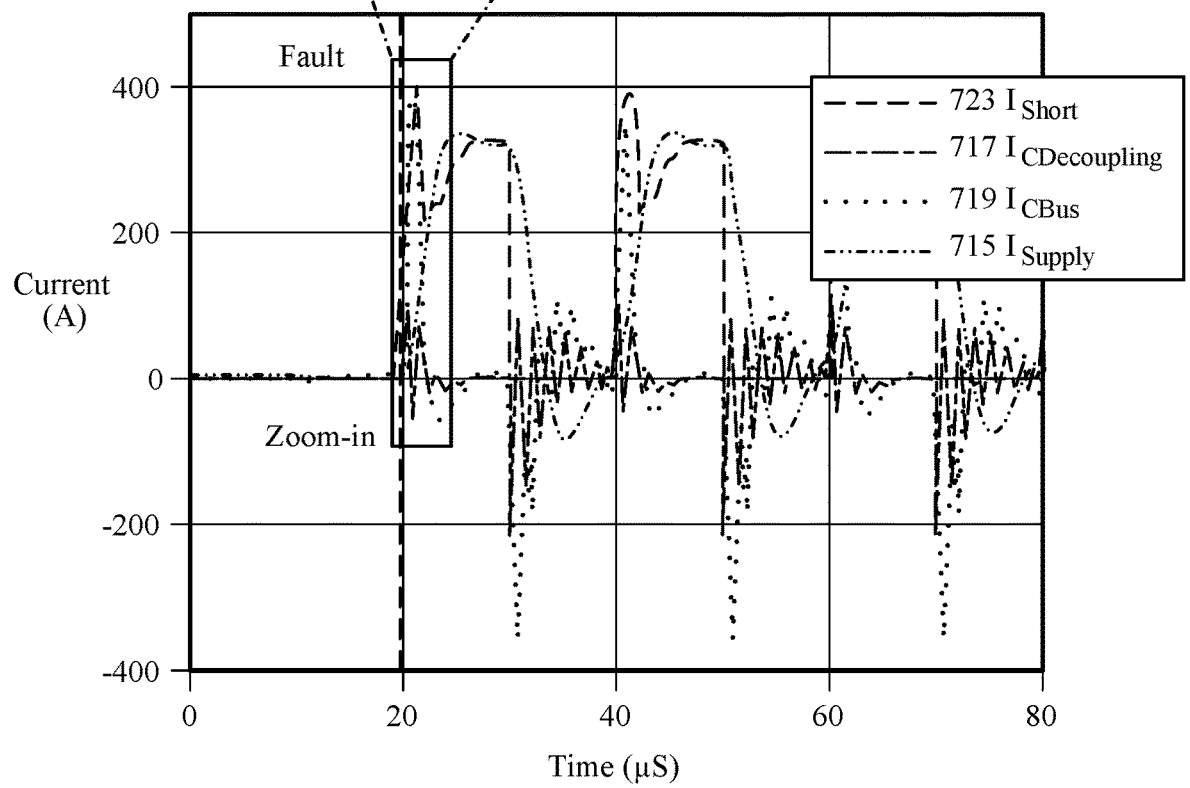
FIG. 8A presents simulation results of a line-to-ground short circuit event in a full-bridge single-phase inverter configuration of FIG. 7 according to some aspects of the disclosure.

FIG. 8A presents simulation results of a line-to-ground short circuit event in a full-bridge single-phase inverter configuration of FIG. 7 according to some aspects of the disclosure. FIG. 8B is a zoomed-in portion of the simulation results of FIG. 8A. The simulation result may be used to determine the primary contributor to the short circuit current at the initial stage of a short circuit event. In FIG. 8B, the short circuit event occurs at 20 μs. For about 330 ns from the short circuit event (i.e., between about 20 μs and 20.33 μs), the decoupling capacitor current, $I_{CDcoupling}$ 717, is the main contributor to the overall short circuit current $I_{Short}$ 723. For ultra-fast short circuit protection (<100 ns), the decoupling capacitor current can be used as the short circuit indicator. The parasitic elements ($Z_1$, $Z_2$, $Z_3$, $Z_4$, $Z_f$, and $Z_L$) in this inverter circuit 700 were estimated using impedance calculator of PCB layout tools, for standard PCB layout and presented in Table 3. Table 3 also presents the equivalent series resistance (ESR) of the DC bus capacitor ($C_{Bus}$) and the ESR of the decoupling capacitor ($C_{Decoupling}$). The parasitic elements of FIG. 7 are substantially similar to the parasitic elements of FIG. 3; the descriptions of which will not be repeated for the sake of brevity and to avoid repetition.

TABLE 3

Parameters of the Circuit Components Including Parasitic Elements In the Simulation

| Component | Value | Description |
|---|---|---|
| $Z_1$ 726 | 100 mΩ, 200 nH | DC source to DC bus impedance |
| $Z_2$ 728 | 1 mΩ, 10 nH | DC bus capacitor to switching network impedance |
| $Z_3$ 730 | 1 mΩ, 10 nH | Decoupling capacitor to switching network impedance |
| $Z_4$ 732 | 1 mΩ, 10 nH | Impedance between two half-bridge switch legs |
| $ESR_{CBus}$ | 3.6 mΩ, 11.5 nH | Equivalent series resistance of the DC bus capacitor |
| $ESR_{CDecoupling}$ | 10 mΩ | Equivalent series resistance of the decoupling capacitor |
| $Z_f$ 734 | 1 mΩ, 10 nH | Fault impedance |

The simulation results show that the decoupling capacitor is the main contributor to the short circuit current for the first 330 ns after the short circuit event occurred (i.e., starting at about 20 μs and to about 20.33 μs), and it shows high di/dt characteristic, which is similar with the short circuit current behavior. These simulation results validate the rationale of using the decoupling capacitor current as the main information for the identification of the short circuit conditions since the protection strategy needs to be completed within a few tens of nanoseconds, and only a short-term of monitoring information is required for the detection.

The main advantage of monitoring the decoupling capacitor current as the short circuit indicator is the SPM. The decoupling capacitor can contribute to the different types of short circuit conditions such as a line-to-ground or a line-to-line fault. Having access to traveling through any semiconductor devices experiencing short circuits, the decoupling capacitor current can be used to identify the short circuit conditions of any semiconductor devices in the power electronics converter. As a result, the detection of short circuit is enabled by placing only one sensor that can monitor the current through the decoupling capacitor.

Capacitor Current Detection Approach

In the proposed single point of short circuit monitoring, layout of the hardware is an important parameter. As the proposed sensing technique detects magnetic field generated from current flowing through the decoupling capacitor, the magnetic field that penetrates the MHz bandwidth non-invasive magnetic current sensor needs to be analyzed. A lateral layout was used for the verification of concept.

Figures 9A, 9B:
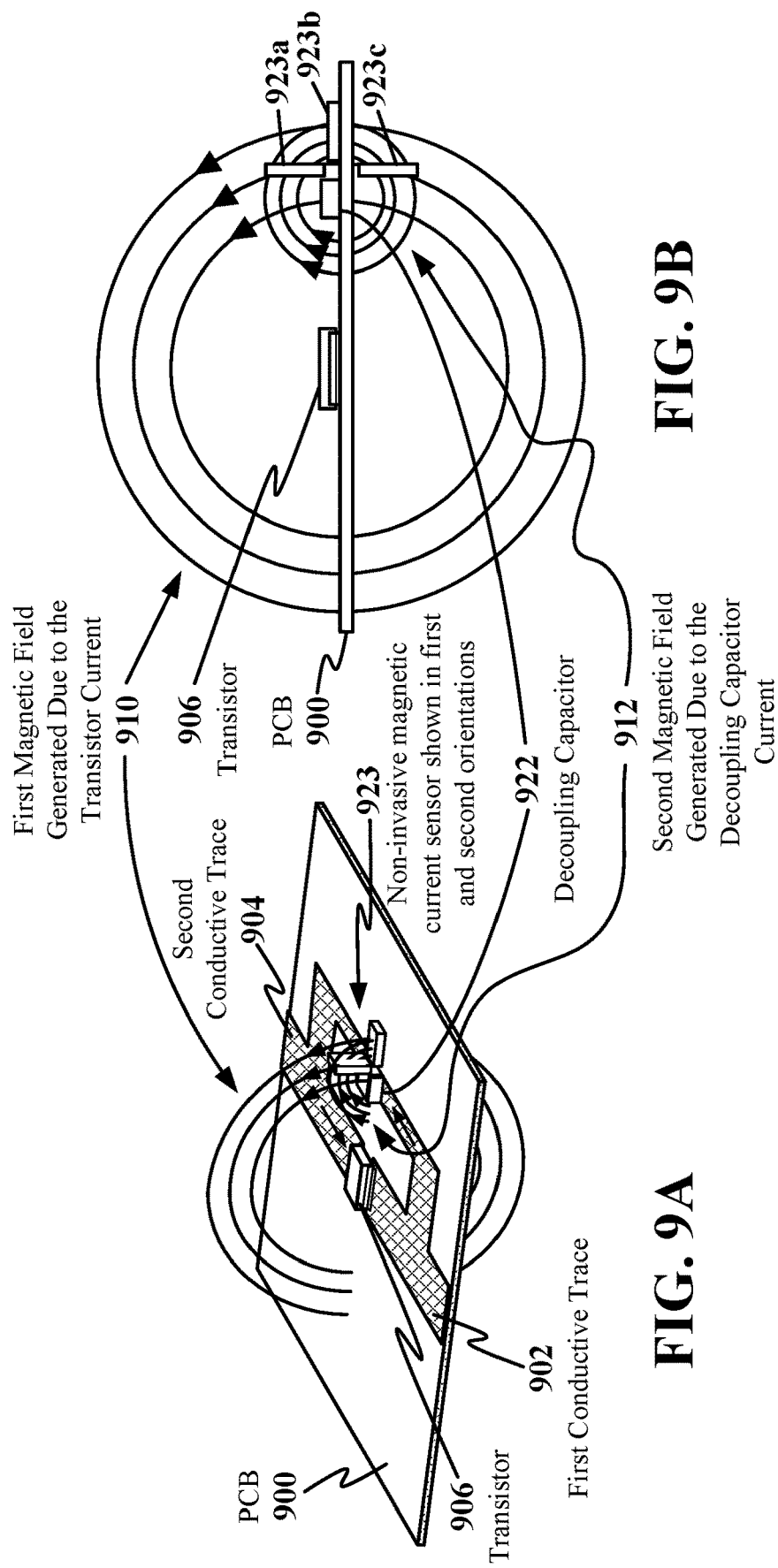
FIG. 9A is a perspective view of a printed circuit board (PCB) having a first conductive trace and a second conductive trace on a first surface of the PCB, a transistor, a decoupling capacitor, and a non-invasive magnetic current sensor according to some aspects of the disclosure.
FIG. 9B is a front elevation view of the PCB of FIG. 9A according to some aspects of the disclosure.

FIG. 9A is a perspective view of a printed circuit board (PCB) 900 having a first conductive trace 902 and a second conductive trace 904 on a first surface of the PCB 900, a transistor 906, a decoupling capacitor 922, and a non-invasive magnetic current sensor 923 according to some aspects of the disclosure. The non-invasive magnetic current sensor 923 is shown in a first location and orientation 923a (spaced apart from the first surface of the PCB 900 and oriented perpendicular to (vertical) the first surface of the PCB 900) and a second location and orientation 923b (on the surface of the PCB 900 and oriented parallel to (horizontal) the surface of the PCB 900) according to some aspects of the disclosure. The first location and orientation 923a and the second location and orientation 923b are alternatives to one another.

FIG. 9B is a front elevation view of the PCB 900 of FIG. 9A according to some aspects of the disclosure. FIG. 9B shows the non-invasive magnetic current sensor 923 in the first location and orientation 923a, the second location and orientation 923b, and a third location and orientation 923c (spaced apart from a second surface of the PCB 900 (opposite to the first surface) and oriented perpendicular to (vertical) the second surface of the PCB 900). The first location and orientation 923a, the second location and orientation 923b, and the third location and orientation 923c are alternatives to one another.

FIGS. 9A and 9B present a first magnetic field distribution 910 due to the current flowing through the transistor 906 and a second magnetic field distribution 912 due to the current flowing through the decoupling capacitor 922. Magnetic field around an electric conductor generated by a current flow through can be determined by Biot-Savart law according to equation 2, below:

$$B(r) = \frac{\mu_0}{4\pi} \int_c \frac{Idl \times r'}{|r'|^3} \qquad (2)$$

where: $\mu_0$ is the magnetic constant, dl a vector along the path of the current flow and r' is the displacement vector of the point where the magnetic field is being evaluated. Based on equation 2, uniform magnetic field lines were drawn in FIGS. 9A and 9B. The directions of the magnetic fields are indicated by arrows.

In summary, FIGS. 9A and 9B show magnetic field distribution in a lateral switching loop. Arrows surrounding the first conductive trace 902 and the second conductive trace 904 indicate current flow direction. Current from a power supply is neglected as its magnitude in the transient moment is insignificant. Three locations and orientations are considered for the non-invasive magnetic current sensor 923; the first location and orientation 923a, the second location and orientation 923b, and the third location and orientation 923c as described above. Lowest penetration of the magnetic field due to the transistor 906 current happens for the first location and orientation 923a and the third location and orientation 923c, whereas maximum penetration happens at the location and orientation 923b. The second magnetic field 912, due to the decoupling capacitor 922, and seen passing through the non-invasive magnetic current sensor 923 at the first location and orientation 923a and at the third location and orientation 923c, is a little bit smaller than at the second location and orientation 923b but still has significant magnetic field to measure the current.

Magnetic field at a certain point due to a constant current flowing through a conductor (e.g., the first conductive trace 902, the second conductive trace 904, the decoupling capacitor 922) is proportional to the current magnitude and inversely proportional to the square of the distance of the point from the conductor. As the same current flows through the switching loop formed of the transistor 906 in parallel with the decoupling capacitor 922, the magnitude of the magnetic field depends on the physical location. As presented in FIGS. 9A and 9B, near the decoupling capacitor 922 the strength of the second magnetic field 912 due to the decoupling capacitor 922 current is higher than the strength of the first magnetic field 910 due to the transistor 906 current. Again, the magnitude of the magnetic field is different at different cross section areas. With the non-invasive magnetic current sensor 923 in the second location and orientation 923b, as both magnetic fields pass the cross section of the non-invasive magnetic current sensor 923 perpendicularly, the non-invasive magnetic current sensor 923 detects both magnetic fields. But at the first location and orientation 923a and the third location and orientation 923c, the first magnetic field 910 generated by the transistor 906 current is almost parallel to the non-invasive magnetic current sensor 923 cross section. Therefore, a very small percentage of that magnetic field is detected by the non-invasive magnetic current sensor 923 at the first location and orientation 923a and the third location and orientation 923c. The second magnetic field 912 generated by the decoupling capacitor 922 passes through the non-invasive magnetic current sensor 923 cross section at the first location and orientation 923a and the third location and orientation 923c close to a 90 degree angle, therefore the non-invasive magnetic current sensor 923 detects nearly the full second magnetic field 912 generated by the decoupling capacitor 922 at the first location and orientation 923a and the third location and orientation 923c. Based on these analyses, the non-invasive magnetic current sensor 923 is placed at the third location and orientation 923c in FIG. 9B. An image of the hardware setup is presented in FIG. 2B.

Additional Experimental Results

To prove the concept described herein, a hardware prototype was developed to compare experiment results with the theoretical analyses and simulation results. There are two main hardware components in the experiment setup, i) the hardware prototype where the fault condition is generated, ii) the fault current sensing element. The developed fault current detecting sensor detects the decoupling capacitor current by sensing the magnetic field generated by the fault current contribution from the decoupling capacitor. The experiment setup is presented in FIG. 2B.

Figure 10:
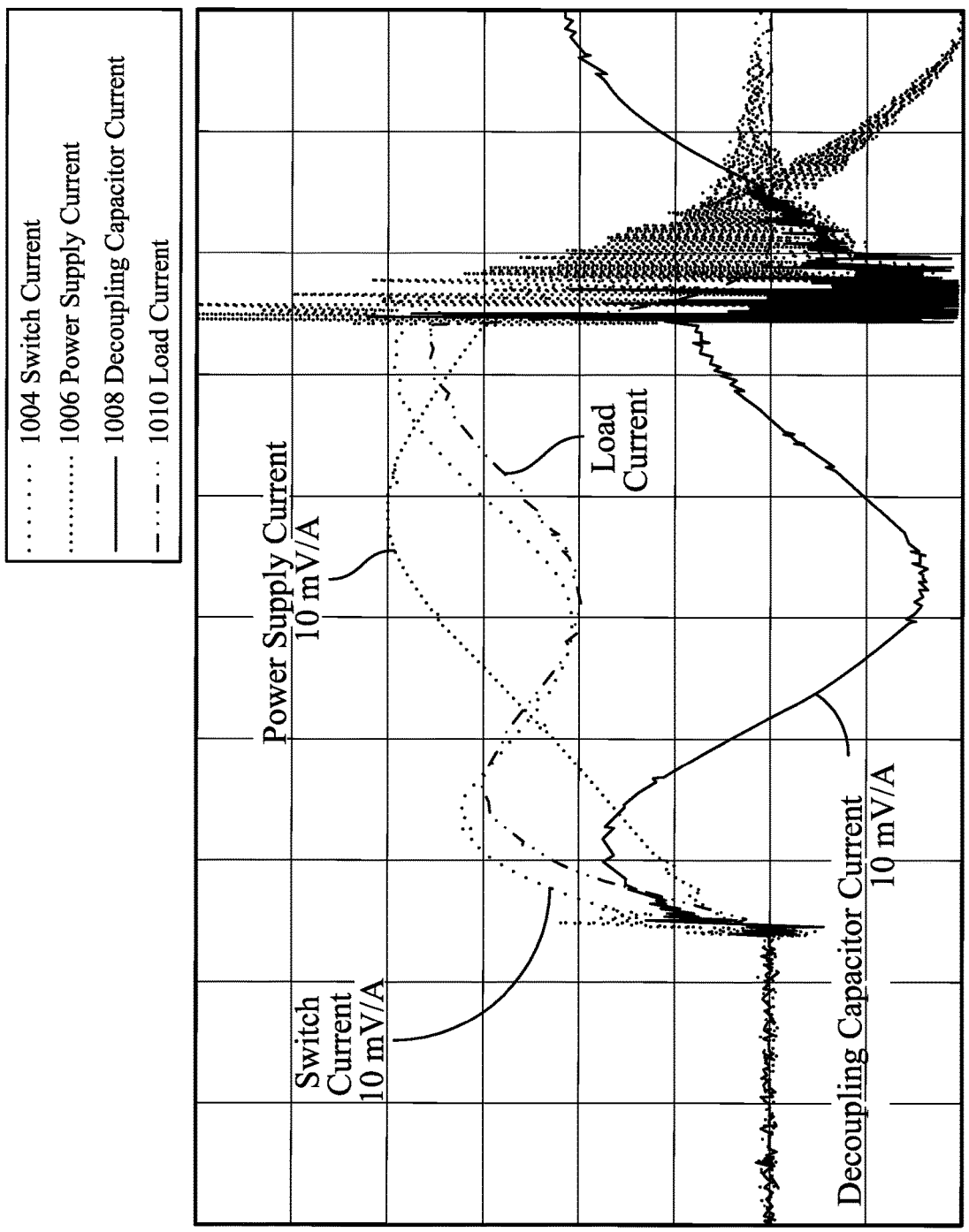
FIG. 10 is a graph illustrating a current distribution in a fault condition according to some aspects of the disclosure.

FIG. 10 is a graph illustrating a current distribution in a fault condition according to some aspects of the disclosure. Switch current 1004 and power supply current 1006 are measured using coaxial shunt resistors and decoupling capacitor current 1008 is calculated based on equation 1. Load current 1010 is also shown.

The characterization setup is designed with a single switch to generate a high rising current to mimic a short circuit condition in a practical application. The experiment setup has a switch current sensing node, a supply (including bus capacitor) current sensing node and another load current monitoring node, which is connected in series with the switch. The first experiment is run to prove the concept that the decoupling capacitor contributes majority of the high rising short circuit current. FIG. 10. presents the experiment results.

Equation 1 was implemented in the oscilloscope to plot the decoupling capacitor current in FIG. 10. The experiment result shows that capacitor current contribution remains significant (more than the supply current) for at least 500 ns in the experiment setup. Of course, this contribution amplitude and duration is design specific and will vary based on different design parameters, which needs to be determined for specific applications to comment about the actual current contribution from the decoupling capacitor. The experiment result supports the theoretical analysis and simulation presented herein.

Short circuit current is higher than normal rated current in order of magnitude with a very high di/dt. The same condition is created by connecting a copper wire instead of an inductor in a DPT configuration. The switch is turned on for a short period of time (50 ns) to protect the switching device from blowing up because of sustained high current. The short circuit current is measured using a shunt resistor connected to the source side of the switch, and the power supply current is measured using another shunt resistor connected to the negative bus of the power supply. The decoupling capacitor current is calculated using equation 1 and the short circuit detecting sensor (i.e., the MHz bandwidth non-invasive magnetic current sensor) is placed next to the decoupling capacitor as presented in FIGS. 2B, 9A, and 9B. The oscilloscope capture is presented in FIGS. 11A, 11B, and 11C.

Figure 11A:
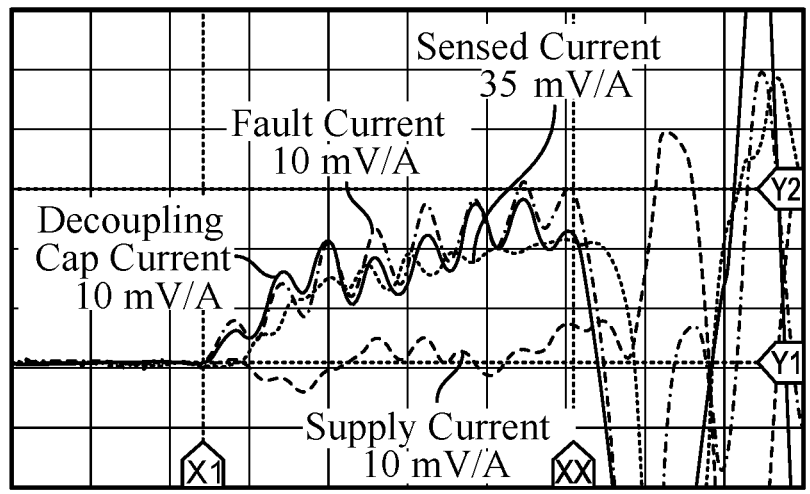
FIGS. 11A, 11B, and 11C depict short circuit detection using decoupling capacitor current measured with the developed sensor according to some aspects of the disclosure.
Figure 11B:
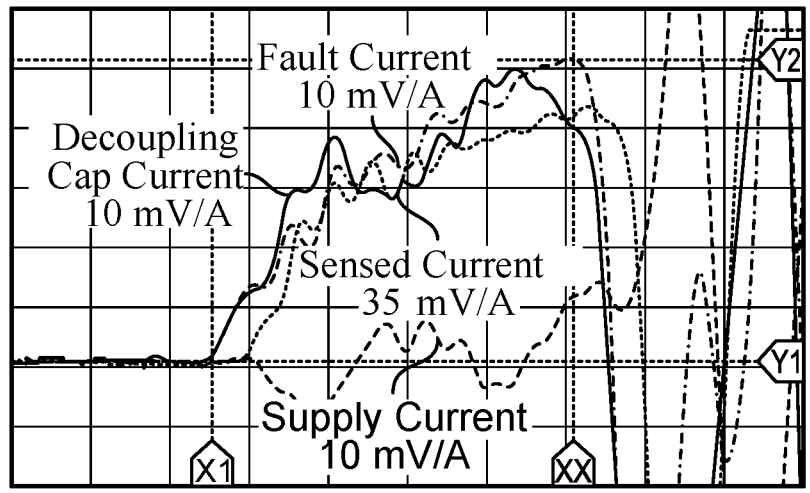
Figure 11C:
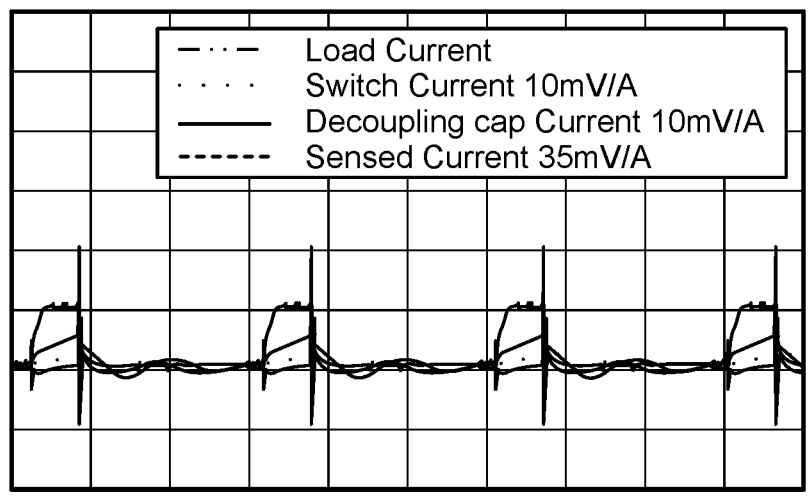

FIGS. 11A, 11B, and 11C depict short circuit detection using decoupling capacitor current measured with the developed sensor (i.e., the MHz bandwidth non-invasive magnetic current sensor) according to some aspects of the disclosure. All the measurements are in the same scale for all the data above. Load current measurement is added in the normal operating condition to show 5 A rated load current.

From the experiment result, it can be seen the sensor picks up the decoupling capacitor current in a similar speed compared to the shunt current measurements with the sensitivity 35 mV/A. FIG. 11A presents a short circuit current of 30 A and FIG. 11B presents a short circuit current of 50 A. In both cases the short circuit current sensor output is consistent in terms of response time and sensitivity. As the intention of the proposed sensor concept is not to measure normal operating current, very accurate current measurement is not mandatory for the proposed sensing approach as long as it captures the short circuit current. But the sensor should be able to distinguish between normal operating condition and short circuit. To see the sensor reading in a normal operating condition, the setup is run with a resistive load for multiple pulses. FIG. 11C presents the experimental results in a normal operating condition. From the experimental results it is very clear that the detected current in a short circuit condition is much larger than a normal operating condition except an overshoot, which can be filtered out in software or hardware.

An ultra-fast short circuit detection strategy is presented for GaN based high frequency power converter. Because of the very fast turn on behavior of GaN power transistors, the short circuit current rise rate is very high. This fast-rising current does not come from the power supply, rather it is supplied primarily from the decoupling capacitor for the first couple of hundred nanoseconds. Therefore, a single point of measurement (SPM) near the decoupling capacitor is proposed for the short circuit protection of multiple switch legs, and a MHz bandwidth magnetic current sensor was developed to capture the transient short circuit current. The concept that the transient short circuit current comes from the decoupling capacitor has been proven from simulation and experiments. The concept has been proven in a hardware prototype consisting of a single switch which is scalable for topologies having multiple switches. The high bandwidth magnetic current sensor was tested in up to 50 A/29 ns fast rising current. As the proposed sensing approach detects short circuit based on the decoupling capacitor current, the decoupling capacitor contribution for specific application needs to be evaluated. Furthermore, as the high bandwidth magnetic current sensor works based on magnetic field, it is highly dependent on layouts.

What is claimed is:

1. A short circuit measurement system, comprising:
    a plurality of half-bridge switch legs;
    a decoupling capacitor coupled in parallel with at least one half-bridge switch leg of the plurality of half-bridge switch legs; and
    a non-invasive magnetic current sensor configured to sense a magnetic field surrounding the decoupling capacitor, substantially generated by a current flowing through the decoupling capacitor, and passing through the non-invasive magnetic current sensor.

2. The short circuit measurement system of claim 1, wherein the non-invasive magnetic current sensor is a megahertz (MHz) bandwidth non-invasive magnetic current sensor.

3. The short circuit measurement system of claim 1, wherein the non-invasive magnetic current sensor is based on a coil network.

4. The short circuit measurement system of claim 1, wherein the non-invasive magnetic current sensor is located such that the magnetic field surrounding the decoupling capacitor, substantially generated by the current flowing through the decoupling capacitor, and passing through the non-invasive magnetic current sensor, passes through the non-invasive magnetic current sensor at substantially a 90 degree angle.

5. The short circuit measurement system of claim 1, further comprising a direct current (DC) bus capacitor, different from the decoupling capacitor, coupled in parallel with the decoupling capacitor, a first capacitance value of the decoupling capacitor being less than a second capacitance value of the DC bus capacitor.

6. The short circuit measurement system of claim 1, wherein a change in the magnetic field surrounding the decoupling capacitor, substantially generated by the current flowing through the decoupling capacitor, and sensed by the non-invasive magnetic current sensor is attributed to a rise in the current flowing through the decoupling capacitor due to a short circuit condition in any one of the plurality of half-bridge switch legs.

7. The short circuit measurement system of claim 1, wherein a short circuit condition in any one of the plurality of half-bridge switch legs is determined within 10 to 400 nanoseconds after a start of the short circuit condition by detecting a change in the magnetic field surrounding the decoupling capacitor, substantially generated by the current flowing through the decoupling capacitor, and passing through the non-invasive magnetic current sensor.

8. The short circuit measurement system of claim 1, wherein a short circuit condition in any one of the plurality of half-bridge switch legs is determined in less than 350 nanoseconds after a start of the short circuit condition.

9. The short circuit measurement system of claim 1, wherein a short circuit condition in any one of the plurality of half-bridge switch legs is determined in less than 150 nanoseconds after a start of the short circuit condition.

10. The short circuit measurement system of claim 1, further comprising:
    a direct current (DC) bus having a first rail and a second rail, wherein DC current flows from the first rail toward the second rail; and
    a DC bus capacitor, different from, and larger in a capacitance value than, the decoupling capacitor, the DC bus capacitor coupled across the first rail and the second rail of the DC bus and coupled in parallel with the decoupling capacitor,
    wherein the non-invasive magnetic current sensor measures a first current flowing through the decoupling capacitor and detects a short circuit condition independent of any measurement of a second current, different from the first current, flowing through the DC bus capacitor.

11. The short circuit measurement system of claim 1, further comprising:
- a direct current (DC) bus having a first rail and a second rail, wherein a DC current flows from the first rail toward the second rail; and
- a DC power supply coupled across the first rail and the second rail of the DC bus and in parallel with the decoupling capacitor,
- wherein the non-invasive magnetic current sensor measures a first current flowing through the decoupling capacitor and detects a short circuit condition independent of any measurement of a second current, different from the first current, flowing through the DC power supply.

12. The short circuit measurement system of claim 1, wherein a short circuit condition in any one of the plurality of half-bridge switch legs is determined based on a single point of measurement, and the single point of measurement is at the decoupling capacitor.

13. The short circuit measurement system of claim 1, wherein a short circuit condition in any one of the plurality of half-bridge switch legs is determined based on a single point of measurement conducted at the decoupling capacitor by the non-invasive magnetic current sensor.

14. The short circuit measurement system of claim 1, wherein the non-invasive magnetic current sensor is oriented to maximize a concentration of magnetic field lines surrounding the decoupling capacitor, substantially generated by the current flowing through the decoupling capacitor, and passing through the non-invasive magnetic current sensor, the concentration of magnetic field lines passing through a cross section of the non-invasive magnetic current sensor at substantially a 90 degree angle.

* * * * *